United States Patent [19]

Hill et al.

[11] 4,397,558

[45] Aug. 9, 1983

[54] SYSTEM FOR REDUCING THE EFFECTS OF BACKGROUND RADIATION

[75] Inventors: Henry A. Hill, Tucson, Ariz.; Paul T. Ballard, Kettering, Ohio

[73] Assignee: The University of Arizona Foundation, Tucson, Ariz.

[21] Appl. No.: 238,058

[22] Filed: Mar. 2, 1981

[51] Int. Cl.$^3$ .............................................. G02B 9/02
[52] U.S. Cl. .............................. 356/354; 350/162.17
[58] Field of Search ...................... 356/345, 354, 360; 350/162.5 F; 343/254

[56] References Cited

U.S. PATENT DOCUMENTS 4,105,289 8/1978 Hershel ........................ 350/162.5 F

OTHER PUBLICATIONS

Matsumura, "Speckle Noise Reduction by Random Phase Shifters", Jap. J. Appl. Phys., vol. 13, No. 3, pp. 557–558, 3/74.
Zehnpfennig et al., "Background Suppression in Double-Beam Interferometry", Applied Optics, vol. 18, No. 12, pp. 1996–2002, 6/79.

Primary Examiner—John K. Corbin
Assistant Examiner—Matthew W. Koren
Attorney, Agent, or Firm—Mason, Kolehmainen, Rathburn & Wyss

[57] ABSTRACT

A system for reducing the effects of background radiation on a desired signal includes a plurality of physically spaced phase shifters arranged in a two-dimensional array and disposed in the path of the desired signal for cancelling the background radiation while passing the desired signal without substantial attenuation. In a second embodiment, the desired signal is split into two beams which traverse different paths and passed through two complementary two-dimensional arrays of physically spaced attenuators, each array being disposed in one of the paths. A phase shifter is disposed in one or both of the paths and the signals from the two paths are recombined to cancel the background radiation. The two-dimensional arrays of physically spaced phase shifters may be integrated into the beam splitters.

50 Claims, 7 Drawing Figures

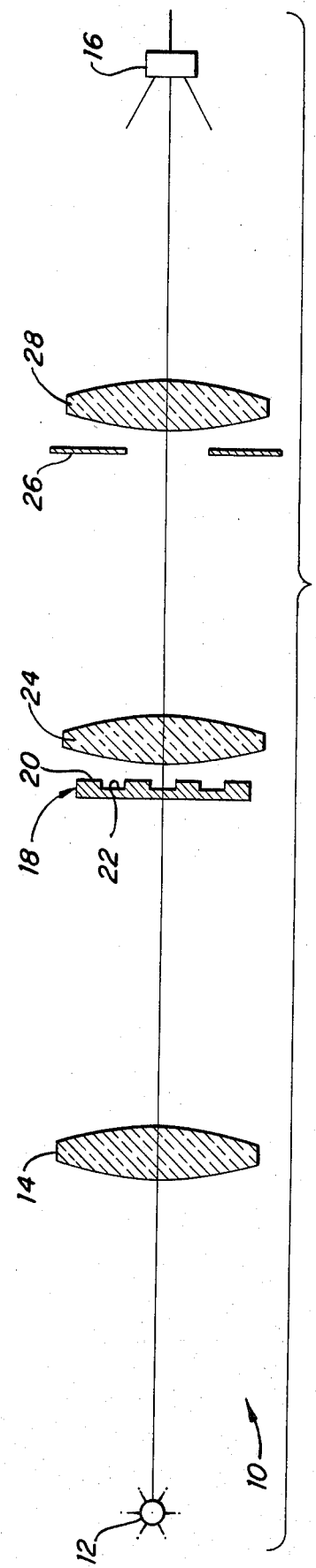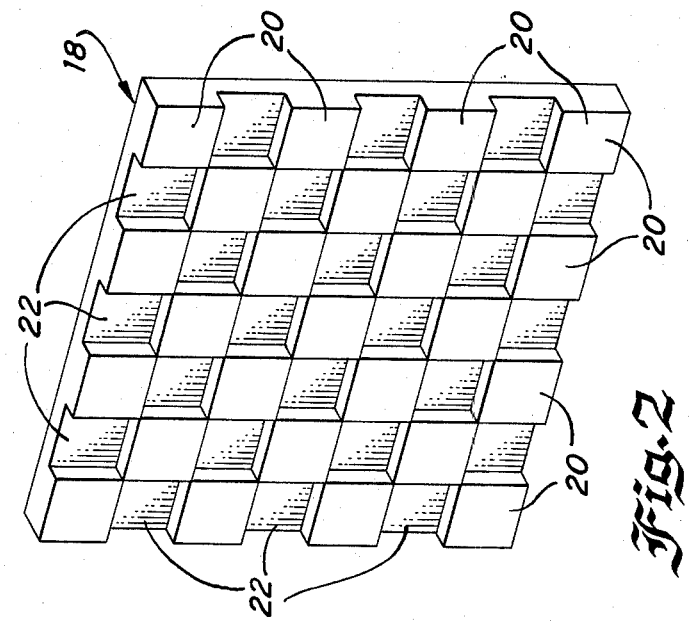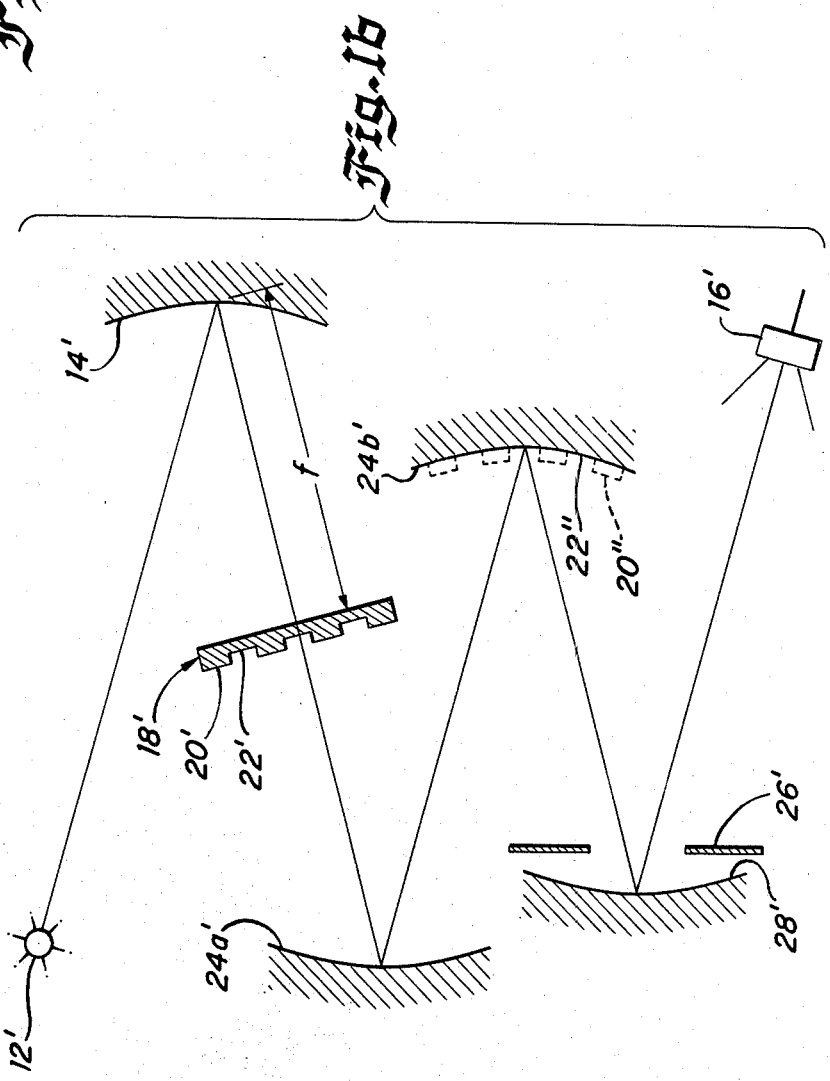

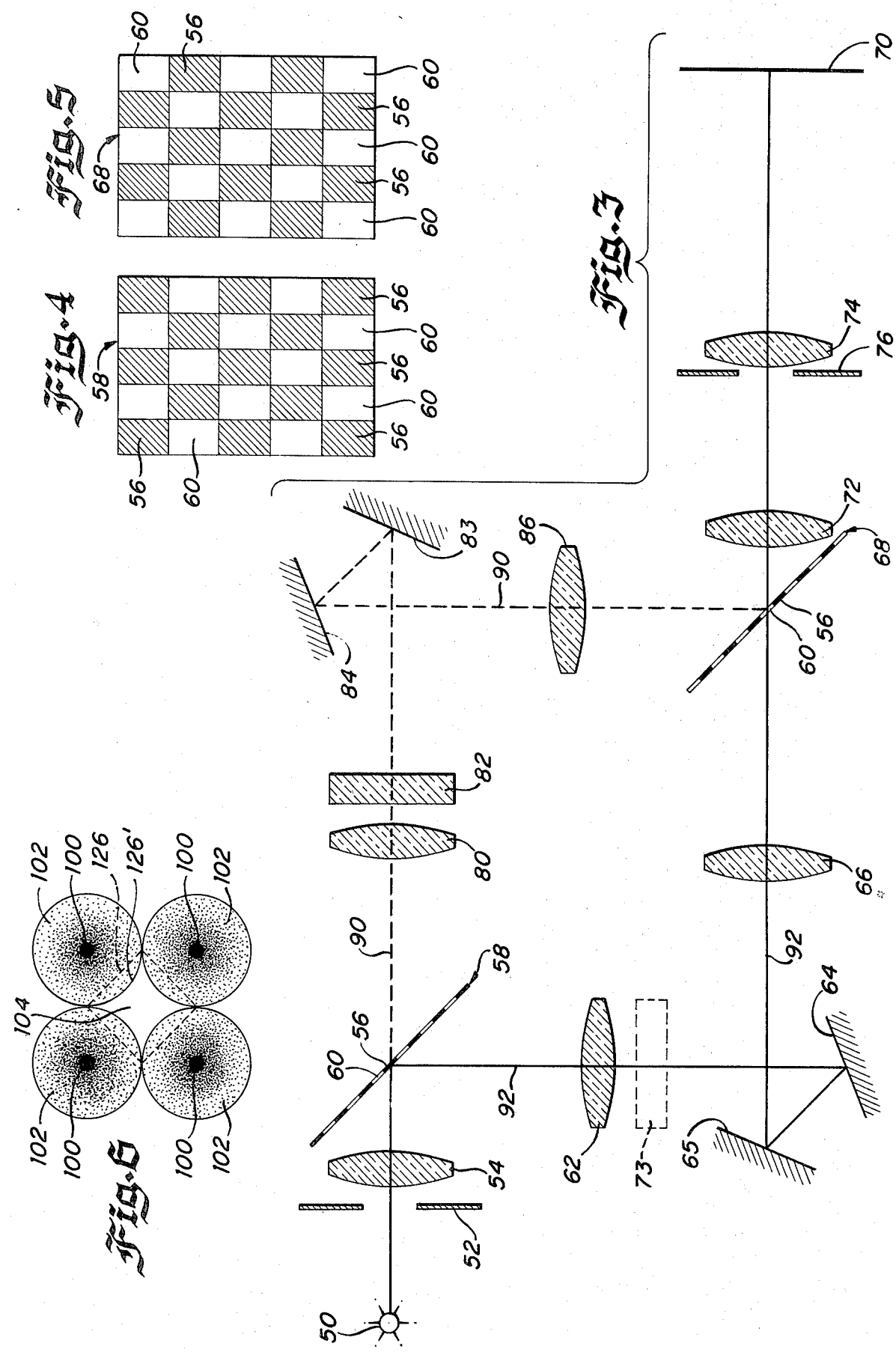

SYSTEM FOR REDUCING THE EFFECTS OF BACKGROUND RADIATION

BACKGROUND OF THE INVENTION

1. Field of the Invention

This invention relates generally to optical and radio instruments, and more particularly, to a device usable for reducing background electromagnetic radiation interferometrically in optical or radio frequency instruments.

Whenever an object is observed through an optical device, or when a signal is detected by an electronic instrument, unwanted background electromagnetic radiation is generally present along with the image of the desired object or desired signal, and tends to obscure the image or signal, particularly if the image or signal is weak. Background radiation arises from sources both internal and external to the optical or electronic instrument. In optical instruments, the internal sources of unwanted background radiation include reflection between the optical elements, diffraction by the effective aperture stop of the optical instrument, lens irregularities, such as bubbles or other inclusions, dust and scratches on the lens surface, and thermal radiation in infrared work. The major external source of scattered light in an optical system is the atmosphere, dust and other particles suspended within the atmosphere, and thermal radiation in the infrared. In electronic instruments, background radiation, or noise, is generated within the amplifier and detector stages of the instrument itself, and radiation external to the instrument includes atmospheric radiation, and radiation from man-made sources, such as various electronic and electrical equipment.

While in many instances, the magnitude of the unwanted background electromagnetic radiation is low relative to the brightness of the optical image or the magnitude of the signal, and does not adversely affect the quality of the image or signal, in other instances, where the brightness of the desired image is quite low, the background radiation can obscure the object or the signal. Such a problem is particularly acute in long distance instruments, such as astronomic telescopes, both optical and radio telescopes, long range receivers, and instruments used near light and radio noise generating urban areas.

2. Description of the Prior Art

Several methods for reducing background radiation are known. These include the use of various occulting discs and coated optical surfaces to reduce surface reflectivity in optical instruments, and low noise supercooled amplification stages in electronic instruments to reduce internally generated undesired radiation. Diversity systems wherein signals received by two separate receivers are coherently combined have been used to reduce the effects of external radiation in electronic systems, and a system used to reduce the effects of both internally and externally generated background radiation utilizing interferometric techniques is described in U.S. Pat. No. 4,213,706.

While these techniques substantially reduce the amount of background radiation, the implementation of such techniques requires the use of apparatus that is costly, cumbersome and requires a high degree of maintenance. More importantly, none of these techniques, with the exception of diversity systems and the technique disclosed in U.S. Pat. No. 4,213,706, are able to effect any reduction in externally generated background radiation. However, while the system described in U.S. Pat. No. 4,213,706 does reduce the effects of externally generated radiation, including on-axis and off-axis radiation, its ability to reduce the effects of radiation that is substantially off-axis is not optimal. Also, diversity systems are generally complex and costly, and do not provide an appreciable increase in signal to noise ratio.

SUMMARY OF THE INVENTION

Accordingly, it is an object of the present invention to provide an improved system for reducing the effects of background radiation that overcomes many of the disadvantages of the prior art devices.

It is another object of the present invention to provide a device that reduces the background radiation resulting from sources located within and external to the system.

It is another object of the present invention to provide a system for reducing the effects of background radiation over a wide range of frequencies, ranging from radio to optical frequencies.

It is another object of the present invention to provide a system for reducing the effects of background radiation that is more effective than prior art systems.

It is another object of the present invention to provide a system for reducing the effects of background radiation that can be used in broadband and narrowband applications, and can be greatly simplified when used in narrowband applications.

In accordance with a preferred embodiment of the invention, an incident beam containing desired radiation and undesired radiation is passed through a two-dimensional array of phase shifters, for example, a checkerboard array, fabricated from a plurality of first phase shifters having a first value of phase shift and a second plurality of phase shifters having a second value of phase shift disposed in alternating rows and columns. Preferably, the difference in values between the phase shift of the first and second phase shifters is on the order of approximately 180°. The desired signal is focused onto a single one of the phase shifters, while the undesired background radiation impinges on a plurality of phase shifters. Consequently, the desired signal, which is focused on a single phase shifter, is simply phase shifted while the background radiation, which impinges on a plurality of phase shifters that provide a difference in phase shift of 180°, is subsequently cancelled.

In an alternative embodiment, the incident beam containing the desired and undesired radiation is split into two beams by a two-dimensional array of physically spaced alternating elements of reflective and transmissive characteristics. A phase shifter is placed in one or both of the split beams so that the phases of the beams emanating from the phase shifters are different, preferably out of phase by 180°. The two beams are then combined to cancel the undesired radiation by a two-dimensional array of physically spaced alternating elements of reflective and transmissive characteristics complementary to the beam splitter. The desired radiation is not cancelled because it is focused on a transmissive element of one array and on a reflective element of the other array. Thus, the desired signal is not split, as is the undesired radiation, and hence, no cancellation occurs.

BRIEF DESCRIPTION OF THE DRAWING

These and other objects and advantages of the present invention may be readily understood from the following detailed description and attached drawing, wherein:

FIGS. 1a and 1b are simplified diagrams of refractive and reflective adaptations of a first embodiment of the system according to the invention;

FIG. 2 is a perspecive view of the array of phase shifters usable in conjunction with the invention illustrated in FIGS. 1a and 1b;

FIG. 3 is a simplified diagram of an alternative embodiment of the present invention particularly suitable for broadband applications;

FIGS. 4 and 5 illustrate the complementary gratings utilized in the embodiment of FIG. 3; and FIG. 6 shows the diffraction pattern of the undesired background radiation produced by the system according to the invention.

DETAILED DESCRIPTION OF THE PREFERRED EMBODIMENT

Referring now to the drawing, with particular attention to FIG. 1a, there is illustrated a refractive adaptation of a first preferred embodiment of the system according to the invention, generally designated by the reference numeral 10. While, as previously stated, the system according to the invention is usable both at radio and optical frequencies, the system illustrated in FIG. 1a (and FIG. 1b) will be discussed with reference to radio frequencies.

The system illustrated in FIG. 1a receives energy from a point source of radio frequency energy 12, which may be, for example, an antenna in a communications link, a satellite or other source of radio frequency, either ground based or in space. In an optical frequency system, the source 12 might be any source of light, visible or invisible or such as a star, planet, laser or the like. A refractive lens element 14 is used, in conjunction with other elements described below, to focus the radio frequency energy from the radio frequency source 12 onto a detector 16.

In accordance with an important aspect of the invention, a phase plate 18 containing a first plurality of phase shifters 20 and a second plurality of phase shifters 22 is interposed between the objective lens 14 and the detector 16. The phase shifters 20 have a first phase shift and are interposed in a two-dimensional array, as illustrated in FIG. 2, between the phase shifters 22, which have a second phase shift different from the phase shift of the phase shifters 20. Although the absolute values of the phase shifts provided by the phase shifters 20 and 22 are not critical, preferably, the difference in the phase shifts provided by the phase shifters 20 and 22 should be 180° in order to effect cancellation of undesired background radiation. To achieve the desired phase shift, the phase shift plate 18 may be fabricated from any suitable dielectic material that is substantially transparent to the desired and undesired radiation being received, and slows down the propagation speed of the radio or light wave passing through it, such as, for example, wood, silicon, glass, ceramic, plastic, etc. Thus, by making the phase shifters 20 thicker (and/or of a different material) than the phase shifters 22, more phase shift is provided by the phase shifters 20 than by the phase shifters 22. The difference is thickness between the phase shifters 20 and 22 required to get the desired 180° phase shift is dependent on the dielectric constant (or index of refraction for optical systems) of the materials used.

A lens 24 is disposed adjacent to and in close proximity with the phase shifter 18, and a stop 26 is separated from the lens 24 by a distance equal to the focal length of the lens 24. A lens 28 is interposed between the stop 26 and the detector 16 and produces a final image of the point source 12 at the detector 16.

In operation, the signal from the point source 12 is focused by the lens 14 onto one of the phase shifters 20 or 22. For extended incoherent sources, each point of the source will behave as a point source so that an image is produced which exhibits the same properties with respect to the reduced background radiation as a single point source. The sizes of the phase shifters 20 and 22 are selected such that they are approximately the same size as the minimum size of an image of a point source that can be formed by the lens 14. Thus, although there may be some overlap onto adjacent phase shifters, most of the energy from the point source 12 is confined to the phase shifter on which the image of the point source 12 is focused. Consequently, when passing through the phase shifter 18, the signal from the source 12 is simply phase shifted by the amount of phase shift introduced by whichever one of the phase shifters 20 or 22 through which it passes. Conversely, background noise impinging on the phase shifter 18 is diffuse and not substantially confined to the area of one phase shifter, but rather is applied to substantially the entire phase shift plate 18. This causes adjacent portions of the wavefront of the undesired radiation to be phase shifted by 180° with respect to each other in a two-dimensional array, thereby resulting in an interference pattern between adjacent portions of the phase shifted wavefront. The resultant interference or diffraction pattern produced by the background radiation impinging on the stop 26 exhibits one or more large central regions of greatly reduced intensity surrounded by areas of increased intensity, with the radiation from the desired radiation source 12 being concentrated in one of the areas of reduced background radiation intensity. The size of the aperture in the stop 26 is made to be substantially the same as the area of reduced intensity, and the aperture stop is positioned to permit the radiation from the source 12 to pass therethrough to be reimaged onto the detector 16 by the lens 28. Thus, since most of the background radiation lies outside the aperture of the stop 26, it is effectively blocked by the stop 26 and prevented from reaching the detector 16, thus improving the signal to noise ratio at the detector 16.

A reflective analog of the system illustrated in FIG. 1a is shown in FIG. 1b. Analogous components in FIGS. 1a and 1b are designated by like reference numerals with those of FIG. 1b being shown as primed numbers. One of the advantages of a reflective system such as the system illustrated in FIG. 1b is that reflective elements are generally less expensive and introduce fewer losses than refractive elements. This is particularly true when large elements are required such as would be the case when viewing distant objects and in systems operating at lower frequencies than optical frequencies. At such frequencies, the reflective elements can be mirrors, or even parabolic or other appropriately shaped dish antennas.

Referring now to FIG. 1b, a reflective element 14' acts as the objective element to receive radiation from a source of desired radiation 12', which may be a source similar to the source 12 described in conjunction with FIG. 1a. The reflective element 14' operates in a manner analogous to that of the lens 14 (FIG. 1a) and images the source 12' substantially onto one of a plurality of phase shifters 20' or 22' of a phase plate 18'. The phase plate 18', as well as the phase shifters 20' and 22' may be similar to the phase plate 18 shown in FIG. 1a. The reflective elements 24a' and 24b' provide a function similar to that of the lens 24 of FIG. 1a. The reflective element 24a' images the phase plate 18' onto the reflective element 24b'. This is similar to placing the lens 24 close to the phase plate 18, as is done in FIG. 1a. An aperture stop 26' is spaced from the reflective element 24b' by a distance equal to the focal length of the reflective element 24b', and positioned to permit desired radiation from the source 12' to pass through the aperture 26'. The interference fringe pattern from undesired sources is positioned on the aperture stop 26' such that an area of reduced intensity is coincident with the opening in the aperture 26', thus preventing most of the undesired radiation from passing through the aperture stop 26'. A reflective element 28', analogous to the lens 28, causes the image of the source 12' to be imaged onto a detector 16'. In an alternative reflective embodiment, the phase plate 18' could be incorporated into the surface of one of the reflective elements, such as the reflective element 24b', for example, by forming the reflective element 24b' such that the reflecting surface is formed by alternating raised and depressed areas, or otherwise. In such an embodiment, the image of the desired source 12' would be substantially imaged onto one of the phase shifters 20" and 22" (or raised or depressed areas) on the surface of the reflective element 24b', either by the reflective elements 14' and 24a', as illustrated in FIG. 1b, or after a suitable repositioning of the reflective elements, by single reflective element, such as the reflective element 14'. Also, a system employing a combination of reflective and refractive elements could be used.

Referring now to FIG. 3, there is shown an alternative embodiment of the present invention particularly suitable for broadband optical applications, and consequently, the embodiment of FIG. 3 will be discussed in optical terms, but the principles are equally applicable to the radio frequency spectrum. In some respects, the embodiment illustrated in FIG. 3 is similar to that disclosed in the previously-cited U.S. Pat. No. 4,213,706; however, the diffraction pattern produced by the embodiment of FIG. 3 is produced by a pair of complementary gratings, rather than by longitudinal shear.

In the embodiment illustrated in FIG. 3, there is provided a first optical path wherein light passes through an aperture stop 52 and an objective lens 54 onto reflective portions 56 of a grating 58 having a plurality of reflecting portions 56 as well as a plurality of transparent portions 60 disposed therebetween (FIG. 4). The grating, as well as the reflective and transparent areas, are rectangular rather than square since the grating is placed at an angle to the incident beam rather than perpendicular to it. The light reflected from the reflective portions 56 passes through another lens 62, is reflected by a pair of mirrors 64 and 65 (or a reflective penta prism), and passes through another lens 66, through transparent portions 60 of a second complementary grating 68 (FIG. 5), and onto an image plane 70 via a pair of lenses 72 and 74 and a second aperture stop 76. Although complementary gratings 58 and 68 are illustrated, it is possible to use similar gratings for the gratings 58 and 68 provided that the gratings 58 and 68 are offset with respect to each other such that light passing through a transparent portion of the grating 58 hits a reflective portion of the grating 68 and vice versa. An optional phase shifter 73, whose function will be described in a subsequent portion of this specification, may be placed in the optical path just described, if desired.

A second optical path is provided through the aperture stop 52, objective lens 54 and the transparent portions of the grating 58, a lens 80, a phase shifter 82, a pair of mirrors 83 and 84 (or a reflective penta prism), and a lens 86 which with lens 80 images the transparent portions of the grating 58 onto the reflective portions of the grating 68 to thereby combine the two beams for focusing by the lenses 72 and 74 onto the image plane 70. The phase shifter 82 is designed to shift the phase of the beam 90, shown in dashed lines by 180° with respect to the beam 92, shown in solid lines. Thus, if no phase shifter 73 is used, the phase shift of the phase shifter 82 must be 180°. Since a phase shift of exactly 180° is difficult to obtain, both the phase shifters 72 and 82 would generally be used, with the phase shifter 72 being used to compensate any offset from 180° provided by the phase shifter 82. Also, all or part of the desired 180° phase shift may be obtained by adjusting the relative lengths of the two optical paths, particularly when operating at wavelengths long enough to permit such an adjustment to be made. Also, by appropriately designing the phase shifters 73 and 82, a broadband phase shifter of the type disclosed in U.S. Pat. No. 4,213,706, incorporated herein by reference, may be formed.

In operation, the light from the desired object 50 is centered onto either a transparent or a reflective portion of the grating 58. If the image of the object 50 is centered on a reflective portion of the grating 58, the image is reflected downwardly along the optical path 92 and through a transparent portion of the grating 68. Conversely, if the image of the object 50 were centered onto a transparent portion of the grating 58, the image would pass through the grating 58 along the optical path 90 wherein it would be reimaged onto a reflective portion of the grating 68 prior to being reimaged onto the focal plane 70. Thus, it is not critical whether the desired object is initially imaged onto a transparent or reflective portion of the grating 58, provided that it is imaged substantially only on a single area and the two gratings 58 and 68 are complementary or offset so that an object imaged on a reflective portion of one of the gratings would be reimaged on a transparent portion of the other grating, or vice versa, since, in order to avoid cancellation of the desired image, the major portion of the radiation from the desired image can only be permitted to travel along one of the paths 90 or 92, and not both.

Undesired background radiation impinging on the focal plane of the objective lens 54 is diffuse, and thus cannot be focused onto a single element of the grating 58 (or grating 68), but covers several elements of the array. Those portions of the undesired radiation imaged on the transparent portion of the grating 58 are passed along the path 90 and imaged onto the reflective portions of the grating 68. Those portions of the undesired radiation appearing on the reflective portions of the grating 58 are passed along the path 92 through the transparent portions of the grating 68. Since there is a 180° phase difference between the paths 90 and 92, the phases of the wavefronts being reflected by the reflective portions of the gratings 68 are 180° out of phase with the wavefronts passing through the transparent portions of the grating 68, thus resulting in a diffraction pattern at stop 76.

The background radiation diffraction pattern at the stop 76 exhibits a central region of greatly reduced intensity with the diffraction pattern of the desired radiation concentrated in the same area. The size of stop 76 is matched to this area of reduced background radiation, thus stopping the radiation and letting through the major portion of the desired signal. The lens 74 reimages the object 50 on to the plane 70 with the background greatly reduced.

As previously discussed, the interference or diffraction pattern resulting from phase shifting the wavefront of the undesired background radiation exhibits a series of alternating areas of high and low intensity arranged in a two-dimensional pattern. A typical pattern is illustrated in FIG. 6. In the pattern illustrated in FIG. 6, areas of high radiation concentration are shown as relatively dark areas, while areas of relatively low concentration are illustrated as light areas. This is the opposite of what would be seen if the pattern were being viewed by the human eye wherein the areas of high concentration would appear lighter than the areas of low concentration, and was done for purposes of ease of illustration. For the same reason, only four areas of high intensity are shown in FIG. 6, but in a practical system many more areas of high and low intensity areas would be present in the outlying areas of the pattern. Also, the rate of transition between the areas of high and low intensity is dependent on the number of phase shifters in the array, with the rate of transition being greater or sharper for systems having a large number of phase shifters or elements in the array or grating.

The areas of high and low concentration are disposed in a rectangular array with a plurality of areas of high concentration 100 being surrounded by areas 102 of gradually decreasing concentration. The concentration in the areas 102 gradually decreases as a function of distance from the areas 100 and serve to form an area 104 of relatively low concentration. Thus, by positioning the diffraction pattern with respect to an aperture stop, such as the stop 76, having a rectangular opening 126 (shown in dashed lines) such that the area of reduced concentration 104 is coincident with the opening 126, most of the undesired radiation is stopped out. If the desired radiation is then concentrated on the opening 126, an improvement in the ratio of desired radiation to undesired radiation is achieved. A still further improvement may be made by curving the edges of the opening in the aperture stop to provide a curvilinear aperture stop designed to match the curvature of the gradient of the undesired radiation to form an aperture 126' (shown in solid lines) having curved edges. Also, making the opening in the stop 52 a rectangle or a square, for example, having a shape similar to the dotted line 126 of FIG. 6, results in a substantially square configuration for the areas 100, 102 and 104 that matches the rectangular opening 126, and also provides an improvement in the signal to noise ratio.

The above described invention has been successfully tested and operated at frequencies of approximately 9.5 gHz and 95 gHz corresponding to wavelengths of 3 cm and 3 mm, respectively. A simplified version of the system illustrated in FIG. 1b was operated at 9.5 gHz and used a reflective mirror to direct desired and undesired radiation onto a wooden phase shifter array. The phase shifter array was fabricated from a four foot by four foot sheet of plywood having six inch squares of plywood affixed thereto to form greater thickness phase shifters similar to the phase shifters 20 illustrated in FIG. 2. The areas between the plywood squares formed the thinner phase shifters similar to the phase shifters 22. Two versions of the 95 gHz system were built and tested. One was similar to the system illustrated in FIG. 1a, and the other was similar to the system shown in FIG. 3. In the latter system, the reflective and transparent areas of the two gratings were approximately 1 cm by 1.4 cm each. For higher frequencies, the phase shifters or transparent and reflective elements may be fabricated utilizing semiconductor fabrication techniques.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A device for reducing the effects of background radiation comprising:
   phase shift means including a plurality of two-dimensionally spaced elements for shifting the phase of a wavefront impinging thereon to produce a wavefront having portions thereof shifted by substantially 180° with respect to each other in a two-dimensional array to thereby produce a diffraction pattern having at least one area of reduced intensity radiation;
   means for receiving an incident beam of radiation containing radiation from a source of desired radiation and undesired radiation and focusing said beam such that most of said desired radiation is concentrated on a single one of said elements while the undesired radiation is spread over several of said elements; and
   means for refocusing the phase shifted wavefront emanating from said phase shift means to produce an image of said source of desired radiation superimposed on an area of reduced intensity radiation.

2. A device as recited in claim 1 further including means including an aperture stop defining an aperture having a size and shape substantially similar to the size and shape of said one area of reduced radiation, said aperture stop being positioned with respect to said phase shifted wavefront such that said aperture is substantially coincident with said one area of reduced radiation and the radiation from said desired radiation source for passing said radiation from said desired radiation source and blocking the undesired radiation not coincident with said aperture.

3. A device as recited in claim 2 wherein said aperture stop defines an aperture having curvilinear sides having a curvature similar to the curvature of the gradient of the undesired radiation.

4. A device as recited in claim 2 wherein said aperture stop is substantially rectangular.

5. A device as recited in claim 4 further including a second aperture stop defining a second substantially rectangular aperture disposed between said incident beam receiving means and said phase shift means, said second aperture stop being operative to render the size and shape of one of said areas of reduced radiation substantially similar to the size and shape of said substantially rectangular aperture.

6. A device as recited in claim 5 wherein said first and second apertures are substantially square.

7. A device as recited in claim 1 wherein said plurality of two-dimensionally spaced elements of said phase shift means includes a plurality of first and second phase shifters having first and second phase shifts, respectively, the difference between said first and second phase shifts being sustantially 180°, said first and second phase shifters being disposed adjacent to each other in an alternating array in two dimensions.

8. A device as recited in claim 7 wherein each of said phase shifters is fabricated from a material that is substantially transparent to said desired and undesired radiation and operative to slow the propagation speed of said desired and undesired radiation, said first phase shifters being operative to slow said radiation more than said second phase shifters to thereby provide said difference in phase shift.

9. A device as recited in claim 8 wherein said first phase shifters are thicker than said second phase shifters.

10. A device as recited in claim 8 wherein said first phase shifters have a greater index of refraction than said second phase shifters.

11. A device as recited in claim 8 wherein said first phase shifters have a greater dielectric constant than said second phase shifters.

12. A device as recited in claim 3 wherein each of said phase shifters has a size substantially equal to the size of the smallest image than can be produced by said receiving and focusing means.

13. A device as recited in claim 7 wherein said phase shifters are square.

14. A device as recited in claim 1 wherein said phase shift means includes a plurality of first elements that are substantially transparent to said desired and undesired radiation and a plurality of second elements that are substantially reflective to said desired and undesired radiation, said first and second elements being disposed adjacent to each other in a two-dimensional array of alternating first and second elements, said first and second elements being operative to split said undesired radiation into first and second beams, said first beam passing through said first elements and said second beam being reflected by said second elements.

15. A device as recited in claim 14 wherein said phase shift means further includes means disposed in the path of at least one of said beams for shifting the phase of one of said beams by substantially 180° with respect to the phase of the other one of said beams, and means for recombining said first and second beams to produce said diffraction pattern.

16. A device as recited in claim 15 wherein said phase shift means is a broadband phase shift means.

17. A device as recited in claim 15 wherein said recombining means includes a second plurality of first elements that are substantially transparent to said desired and undesired radiation and a second plurality of second elements that are substantially reflective to said desired radiation and undesired radiation disposed adjacent to each other in a second two-dimensional array of alternating first and second elements, said second two-dimensional array being disposed in the path of both of said first and second beams, said second array being positioned with respect to said first and second beams such that the radiation passing through the first elements of said array are incident on the second elements of said second array, and the radiation reflected from said second elements of said array are passed through the first elements of said second array.

18. A device as recited in claim 17 wherein said array is disposed at substantially a 45° angle with respect to said beam of desired and undesired radiation, and said second array is disposed at substantially a 45° angle with respect to both of said first and second beams.

19. A device as recited in claim 14 wherein each of said elements has a size substantially equal to the size of the smallest image that can be formed on said array by said receiving and focusing means.

20. A device as recited in claim 14 wherein said elements are rectangular.

21. A system for reducing the effects of undesired radiation comprising:
means including a two-dimensional array of first and second phase shifters having two different values of phase shift alternated with each other in two dimensions for phase shifting the wavefront of an incident beam of desired radiation from a desired object and undesired radiation to provide an interference pattern having a two-dimensional array of areas of increased and reduced intensity of the undesired radiation alternated with each other in two dimensions; and
means for concentrating said desired radiation onto a reduced intensity area of said interference pattern.

22. A system as recited in claim 21 wherein said two-dimensional array includes a two-dimensional array of reflective phase shifters having surfaces offset with respect to each other to generate two different values of phase shift that are different from each other by substantially 180°.

23. A system as recited in claim 22 wherein said array of first and second phase shifters form a mirror having a predetermined focal length.

24. A system as recited in claim 21 wherein the values of the phase shifts produced by said first and second phase shifters are different by substantially 180°.

25. A system as recited in claim 24 wherein each of said phase shifters is fabricated from a material that is substantially transparent to said desired and undesired radiation and operative to slow the propagation speed of said desired and undesired radiation, said first phase shifters being operative to slow said radiation more than said second phase shifters to thereby provide the different phase shifts.

26. A system as recited in claim 25 wherein said first phase shifters are thicker than said second phase shifters.

27. A device as recited in claim 25 wherein said first phase shifters have a greater index of refraction than said second phase shifters.

28. A device as recited in claim 25 wherein said first phase shifters have a greater dielectric constant than said second phase shifters.

29. A system as recited in claim 24 wherein said system includes means for focusing most of the desired radiation onto a single phase shifter and wherein each of said phase shifters has a size substantially equal to the size of the smallest image that can be produced by said focusing means.

30. A system as recited in claim 29 wherein said phase shifters are square.

31. A system as recited in claim 24 further including means including an aperture stop defining an aperture having a size and shape substantially similar to the size and shape of one of said reduced intensity areas, said aperture stop being positioned with respect to said interference pattern such that said aperture is substantially coincident with one of said reduced intensity areas and the concentrated desired radiation concentrated thereon.

32. A device as recited in claim 31 wherein said aperture stop defines an aperture having curvilinear sides having a curvature similar to the curvature of the gradient of the undesired radiation.

33. A device as recited in claim 31 wherein said aperture stop is substantially rectangular.

34. A device as recited in claim 31 further including a second aperture stop defining a second aperture disposed between said incident beam receiving means and said phase shift means, said second aperture stop being operative to render the size and shape of one of said areas of reduced radiation substantially similar to the size and shape of said first aperture.

35. A device as recited in claim 34 wherein said first and second apertures are substantially square.

36. A system as recited in claim 31 wherein said concentrating means includes a refractive element.

37. A system as recited in claim 31 wherein said concentrating means includes a reflective element.

38. A system for reducing the effects of undesired radiation comprising:
- a first two-dimensional array of transparent and reflective elements, said transparent and reflective elements being alternated with each other in two dimensions;
- first means for directing an incident beam containing desired radiation from a source of desired radiation and undesired radiation onto said first array, said first array being operative to pass a first portion of the incident beam through said transparent elements and to reflect a second portion of the incident beam from said reflective elements;
- a second two-dimensional array of transparent and reflective elements, said transparent and reflective elements being alternated with each other in two dimensions;
- second means for directing said first portion of the incident beam onto said reflective elements of said second two-dimensional array; and
- third means for directing said second portion of the incident beam onto said transparent elements of said second two-dimensional array, one of said second and third directing means including phase shifting means for shifting the phase of one of said first and second portions of said incident beam with respect to the phase of the other, said second two-dimensional array being operative to combine said first and second portions of said incident beam to thereby generate an interference pattern of said undesired radiation having a two-dimensional array of areas of increased and reduced intensity alternated with each other in two dimensions, said desired radiation being concentrated on one of said reduced intensity areas.

39. A system as recited in claim 38 wherein said phase shifting means includes means for shifting the phase of said one of said first and second portions of said incident beam with respect to the phase of the other by substantially 180°.

40. A system as recited in claim 39 wherein said phase shift means is a broadband phase shift means.

41. A system as recited in claim 39 wherein each of said transparent and reflective elements has a size substantially equal to the size of the smallest image that can be produced thereon by said incident beam directing means.

42. A system as recited in claim 41 wherein said first array is disposed at substantially a 45° angle with respect to said incident beam containing desired radiation and undesired radiation, and said second array is disposed at substantially a 45° angle with respect to both of said first and second portions of said incident beam.

43. A system as recited in claim 42 wherein said elements are rectangular.

44. A system as recited in claim 43 further including means including an aperture stop defining an aperture having a size and shape substantially similar to one of the areas of reduced intensity, said aperture stop being positioned with respect to said interference pattern such that said aperture is substantially coincident with one of said reduced intensity areas and the concentrated desired radiation concentrated thereon.

45. A system as recited in claim 44 further including means for receiving and refocusing said concentrated desired energy.

46. A method for reducing the effects of undesired background radiation comprising the steps of:
- phase shifting the wavefront of an incident beam containing desired radiation from a desired radiation source and undesired radiation in a manner to generate a two-dimensional array of two different phases alternated with each other in the two dimensions of provide a two-dimensional interference pattern of said undesired radiation having areas of increased and reduced intensity alternating in the two dimensions; and
- concentrating the radiation from said desired radiation source onto one of the reduced intensity areas of the undesired radiation interference pattern thereby to isolate the desired radiation from said undesired radiation.

47. The method recited in claim 46 wherein the step of phase shifting the wavefront includes the step of selecting the two different phases such that they are different from each other by substantially 180°.

48. A method for reducing the effects of undesired background radiation comprising the steps of passing an incident beam containing desired radiation from a desired radiation source and undesired radiation through means for shifting the wavefront of said undesired radiation in a two-dimensional array having a first value of phase shift and a second value of phase shift different than said first value, said two-dimensional array having rows and columns of alternating ones of said first and second phase shift, thereby generating an interference pattern having a two-dimensional array of areas of increased and reduced intensity of the undesired radiation alternated with each other in two dimensions, and concentrating said desired radiation onto a reduced intensity area of said interference pattern, and detecting the desired radiation after it has been passed through said array.

49. The method recited in claim 48 further including the step of focusing the incident beam containing said desired radiation from the desired radiation source and undesired radiation such that the image of the desired radiation source is imaged substantially on a single one of said phase shifters.

50. The method recited in claim 49 wherein the step of detecting the beam after having passed through said array includes the step of focusing the beam onto a detector.

* * * * *